United States Patent
Li et al.

(10) Patent No.: US 9,002,306 B2
(45) Date of Patent: Apr. 7, 2015

(54) PROVIDING MULTIPLE INDUCTORS FOR A RADIO TUNER

(71) Applicant: Silicon Laboratories Inc., Austin, TX (US)

(72) Inventors: Jing Li, Austin, TX (US); Dan B. Kasha, Seattle, WA (US); Aslamali Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/452,024

(22) Filed: Aug. 5, 2014

(65) Prior Publication Data

US 2014/0342681 A1 Nov. 20, 2014

Related U.S. Application Data

(62) Division of application No. 13/073,538, filed on Mar. 28, 2011, now Pat. No. 8,818,309.

(51) Int. Cl.
*H04B 1/18* (2006.01)
*H04J 3/20* (2006.01)
*H03J 5/24* (2006.01)

(52) U.S. Cl.
CPC .. *H04B 1/18* (2013.01); *H03J 5/244* (2013.01)

(58) Field of Classification Search
CPC ............... H04B 1/18; H04J 3/20; H04J 5/24
USPC ................. 455/191.2, 87, 191.1, 197.2, 340, 455/193.1, 193.2, 187.1, 195.1, 197.3, 455/252.1, 333, 334, 120, 125; 327/553, 327/552; 333/172
See application file for complete search history.

(56) References Cited

U.S. PATENT DOCUMENTS

| | | | |
|---|---|---|---|
| 4,107,621 | A | 8/1978 | Furutani et al. |
| 5,270,667 | A | 12/1993 | Upton |
| 6,075,414 | A | 6/2000 | Nagaoka et al. |
| 6,147,568 | A | 11/2000 | Souetinov |
| 6,181,206 | B1 | 1/2001 | Palmisano et al. |
| 6,323,735 | B1 | 11/2001 | Welland et al. |
| 6,356,745 | B1 | 3/2002 | Lee et al. |
| 6,400,204 | B1 | 6/2002 | Davis |
| 6,483,390 | B2 | 11/2002 | Welland |
| 6,553,216 | B1 | 4/2003 | Pugel et al. |
| 6,658,244 | B2 | 12/2003 | Schmal et al. |

(Continued)

OTHER PUBLICATIONS

*Silicon Laboratories Inc.* (Plaintiff), vs. *Quintic Corporation and Quintic Microelectronics Co., Ltd.* (Defendants), Civil Action No. A10CA066 SS, Complaint for Patent Infringement filed on Jan. 25, 2010, in the United States District Court Western Division of Texas Austin Division.

(Continued)

*Primary Examiner* — Pablo Tran
(74) *Attorney, Agent, or Firm* — Trop, Pruner & Hu, P.C.

(57) ABSTRACT

A method includes receiving a desired channel indication in a radio tuner, determining a band of operation in which the channel is located, and if the channel is within a first band coupling multiple inductors into a resonant tank, and if the desired channel is within a second band coupling a single inductor into the resonant tank.

20 Claims, 6 Drawing Sheets

(56) References Cited

U.S. PATENT DOCUMENTS

| | | | |
|---|---|---|---|
| 6,683,511 B2 | 1/2004 | Souetinov et al. | |
| 6,724,827 B1 | 4/2004 | Patsiokas et al. | |
| 6,735,418 B1 | 5/2004 | MacNally et al. | |
| 6,771,475 B2 | 8/2004 | Leete | |
| 6,816,559 B1 | 11/2004 | Sirito-Olivier et al. | |
| 7,127,217 B2 * | 10/2006 | Tuttle et al. | 455/87 |
| 7,202,749 B2 | 4/2007 | Mohammadi | |
| 7,209,727 B2 | 4/2007 | Castaneda et al. | |
| 7,272,375 B2 | 9/2007 | Tuttle et al. | |
| 7,355,476 B2 | 4/2008 | Kasha et al. | |
| 7,369,817 B2 | 5/2008 | Takikawa et al. | |
| 7,386,284 B2 | 6/2008 | Thompson | |
| 7,426,376 B2 | 9/2008 | Srinivasan | |
| 7,512,386 B2 | 3/2009 | Kalajo et al. | |
| 7,649,407 B2 * | 1/2010 | Rohani et al. | 327/553 |
| 7,660,566 B2 | 2/2010 | Kuo et al. | |
| 7,667,542 B2 | 2/2010 | Kasha et al. | |
| 7,697,901 B2 | 4/2010 | Sridharan et al. | |
| 7,711,329 B2 | 5/2010 | Aparin et al. | |
| 7,725,095 B2 | 5/2010 | Tey et al. | |
| 8,116,706 B1 * | 2/2012 | Clement et al. | 455/179.1 |
| 8,149,955 B2 | 4/2012 | Tired | |
| 8,180,312 B2 | 5/2012 | Brobston et al. | |
| 8,185,081 B2 * | 5/2012 | Russell et al. | 455/307 |
| 8,254,862 B2 * | 8/2012 | Kasha et al. | 455/150.1 |
| 8,280,319 B2 * | 10/2012 | Kasha et al. | 455/91 |
| 8,463,215 B2 * | 6/2013 | Kasha et al. | 455/150.1 |
| 8,725,098 B2 * | 5/2014 | Shana'a et al. | 455/192.2 |
| 2003/0083836 A1 * | 5/2003 | Spencer | 702/107 |
| 2007/0200628 A1 * | 8/2007 | Leete | 330/254 |
| 2010/0156575 A1 * | 6/2010 | Shah et al. | 334/78 |
| 2011/0316631 A1 * | 12/2011 | Rafi | 330/277 |

OTHER PUBLICATIONS

U.S. Appl. No. 12/649,011, filed Dec. 29, 2009, entitled "Integrating Components in a Radio Tuner Integrated Circuit (IC) for a Tracking Filter," by Dan B. Kasha, et al.

U.S. Appl. No. 12/649,006, filed Dec. 29, 2009, entitled "Configurable Radio Front End," by Dan B. Kasha, et al.

* cited by examiner

PROVIDING MULTIPLE INDUCTORS FOR A RADIO TUNER

This application is a divisional of U.S. patent application Ser. No. 13/073,538, filed Mar. 28, 2011, the content of which is hereby incorporated by reference.

BACKGROUND

Historically, radios were realized by incorporating various discrete components into a system such that radio frequency (RF) signals received at an antenna could be processed to output audio signals of a given band. Such discrete circuitry however is consuming in ways of cost and space. Furthermore, typically the circuitry is dedicated to a particular frequency band and thus a multi-band radio could require much circuitry.

More recently, semiconductor-based radios have been introduced that provide for multi-band operation. Even in these radios, certain amounts of duplicative circuitry may be needed to handle the multiple bands. In addition, coupling an antenna to a semiconductor-based radio can create some challenges. For example in design of a receiver, the input voltage received is sought to be maximized so that the input signal-to-noise ratio (SNR) is maximized. However, impedance of an antenna will vary significantly across frequency, especially across multiple frequency bands. Furthermore, the antenna impedance is often unknown and depends heavily on the environment. For example, the impedance of a headphone antenna that typically is used in portable audio devices can be quite different depending on the distance of the portable device to the human body.

Therefore, one design philosophy is to form an external parallel resonance network so that the impedance of the RF front-end network including a RF low noise amplifier (LNA) appears as high impedance to the antenna. By doing that, the received voltage from the antenna will be received at the RF LNA input with minimal loss. Varactors are typically used to form the parallel resonance network in order to resonate across frequency. However, it is difficult if not possible to resonate a single varactor across multiple frequency bands. For example, a resonating range from 76 MHz to 240 MHz is needed in order to cover both the FM/HD (76-108 MHz) and DAB/DAB+/T_DMB VHF band (174-240 MHz). To do that, the maximum/minimum capacitance ratio of the varactor needs to be over 10, which can be very difficult to achieve in current semiconductor technologies using a single varactor and inductor.

SUMMARY OF THE INVENTION

According to one aspect, the present invention is directed to a radio tuner that has a radio frequency (RF) front end including a low noise amplifier (LNA) and which is implemented in an integrated circuit (IC). The tuner, via the front end, can receive and process RF signals of multiple frequency bands. The front end may include a varactor to provide a selected capacitance level to resonate with an inductance (which can be on-chip or off-chip, or formed of combinations of on-chip and off-chip inductances). The tuner further includes a controller to cause the inductance to be of a selected level depending on frequency band of the RF signal.

Different implementations for connecting the inductance can occur. For example, multiple inductors may be present including first and second inductors, where a resonant tank is formed of the inductors and the varactor. The controller can enable a selective coupling of at least one of the inductors to be included in the resonant tank.

Another aspect of the present invention is directed to a system including an antenna and a radio tuner, such as described above. A controller of the tuner can to cause the inductance to be of a selected level based on a frequency band of a desired radio channel. The controller can further control the varactor responsive to the desired radio channel. In different implementations, a first inductor can be fixably coupled to a pin of the IC, while a second inductor can be controlled to be coupled in parallel with the first inductor via another pin.

A still further aspect is directed to an apparatus that includes a radio tuner having an RF front end including a varactor to provide a selected capacitance level to resonate with an inductance. A controller of the tuner can cause an additional capacitor to be coupled with the inductance based on a frequency band of the RF signal.

Yet another aspect of the present invention is directed to a method including receiving a desired channel indication in a radio tuner, determining a band of operation in which the channel is located, and if the channel is within a first band coupling multiple inductors into a resonant tank, and if the desired channel is within a second band, coupling a single inductor into the resonant tank.

DETAILED DESCRIPTION

In various embodiments, a RF tuner can be provided with a front end that can be used at different frequency bands of operation. To this end, the tuner may be incorporated in a system that includes multiple inductances to enable a single varactor (which may be an on-chip varactor) to be used across a wide frequency range covering multiple frequency bands. As an example, in one embodiment multiple off-chip inductors can be provided, with at least one of the inductors selectively controllable to be switched into or out of a resonant tank circuit, based at least in part on a given band of operation of the RF tuner. While the scope of the present invention is not limited in this regard, in one embodiment the RF tuner may be a mixed signal integrated circuit including a receiver to handle multiple bands. For example, in one embodiment a single chip radio tuner may be able to handle FM/HD band as well as DAB/DAB+/T-DMB bands.

Furthermore, understand that in some embodiments this tuner chip may have only a single RF front end signal path, thus reducing chip size and complexity. Accordingly, RF signals regardless of band may be provided to and processed in this single RF path. Furthermore, by interfacing with multiple inductances, a single varactor can easily be made to reach these multiple bands, without the need for multiple varactors for use with the front end. That is, a maximum/minimum capacitance ratio of the varactor may be relatively low given the multiple inductors available. As such, a single varactor of a given semiconductor process can easily meet the required ratio.

Figure 1A:
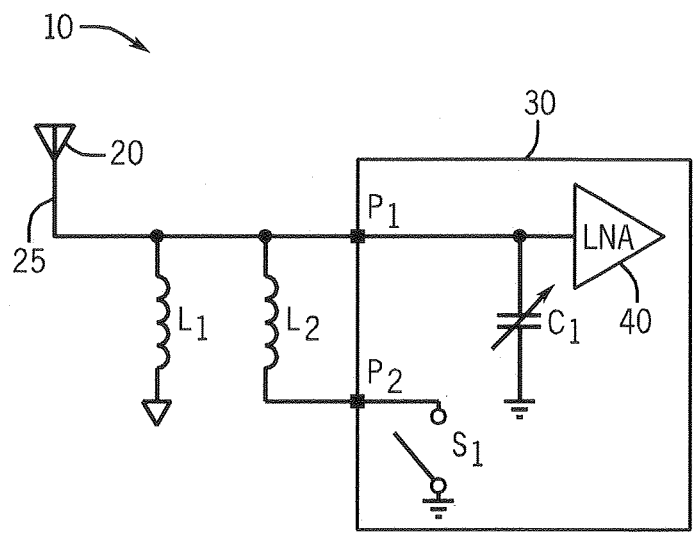
FIG. 1A is a block diagram of a system including a tuner in accordance with one embodiment of the present invention.

Referring now to FIG. 1A, shown is a block diagram of a system including a tuner in accordance with one embodiment of the present invention. As shown in FIG. 1A, system 10 may be part of a user device such as a portable media player, smart phone, audiovisual receiver, car stereo, or so forth. As seen in FIG. 1A, system 10 includes an antenna 20 to receive incoming RF signals. As discussed above these RF signals may be of various bands depending on the particular tuner implementation. For purposes of discussion, understand that these bands may extend over a relatively wide frequency range. For example, FM/HD signals may be in the range of approximately 76-108 MHz (depending on country). In turn, DAB or DMB signals may be in the range of approximately 174-240 MHz.

As seen in FIG. 1A, antenna 20 may be coupled to a tuner IC 30. More specifically, a signal pathway 25 couples antenna 20 to a first pin P1 of tuner IC 30. Signal path 25 may be implemented via a conductive trace on a circuit board that further includes inductors L1 and L2. As seen, this pin P1 of the IC may be coupled to a low noise amplifier (LNA) 40. In some embodiments, this LNA may have a high input impedance (e.g., higher than the antenna impedance, for example, at least twice the antenna impedance). While shown with a single-ended implementation in FIG. 1A, in other embodiments a differential implementation is possible. As seen in FIG. 1A, a resonant tank may be formed by a combination of inductance and capacitance, both present within the IC as well as off-chip. In the embodiment of FIG. 1A, a resonant tank may be formed of on-chip varactor C1, which one embodiment may be implemented via a digitally controlled capacitor array coupled between pin P1 and a ground potential, and at least one of the pair of off-chip inductances L1 and L2.

As seen in the FIG. 1A embodiment, a first inductance L1 may be an inductor that is fixably coupled between the signal pathway and a ground potential (e.g., via a ground plane of the circuit board). Thus, the resonant tank may be formed of inductance L1 and varactor C1. In addition, depending on band of operation a second inductance L2 may be switchably coupled to be part of this resonant tank. In one embodiment, this second inductance L2 may be coupled via a second pin of tuner IC 30, namely pin P2 and via a switch S1 to a ground potential node (which may be of the IC itself or an externally referenced ground such as may be supplied via another pin of the IC, not shown in the basic illustration of FIG. 1A). In one embodiment, during FM/HD band operations, switch S1 may be disabled or open such that inductance L2 is not part of the resonant tank, and thus the resonant tank is formed of inductance L1 and varactor C1. In contrast, for a different band operation (e.g., a DAB band) switch S1 may be active or closed such that the resonant tank is formed of the parallel inductances L1 and L2 in combination with varactor C1. In one embodiment, switch S1 may be implemented via a MOS-FET. In such an embodiment, the MOSFET may have a gate terminal coupled to receive a control signal received from a controller of the tuner IC (not shown for ease of illustration in the embodiment of FIG. 1A). In one embodiment, this controller of the tuner may be a microcontroller unit (MCU), although the scope of the present invention is not limited in this regard. While shown with this particular implementation in the embodiment of FIG. 1A, understand components can be differently configured.

For example, rather than being hardwired to the input of LNA 40 (and thus also to input pin P1), varactor C1 can be switchably coupled to the input pin/LNA. In this way, the controller can selectively enable the varactor to be switched into the circuit in a particular implementation. But in a given installation, the on-chip varactor may be de-selected in favor of using an off-chip varactor having a higher Q, for example. In still further embodiments, rather than being coupled directly to input pin P1 and LNA 40, varactor C1 can instead be directly coupled to another pin of the IC (not shown for ease of illustration in FIG. 1A). Then this pin can be coupled, e.g., via an off-chip interconnect to the input signal line and thus through input pin P1 to LNA 40. Note also in the embodiment of FIG. 1A (and other Figures), the on-chip reference potentials are shown with a different symbol than the off-chip external reference node, which may be coupled to an external reference plane. Although shown as different symbols, these reference potentials may be at the same or different levels, depending on a particular implementation. Note that in some embodiments, ESD protection, which can be implemented by on-chip elements such as diodes, may be provided for the varactor.

Figure 1B:
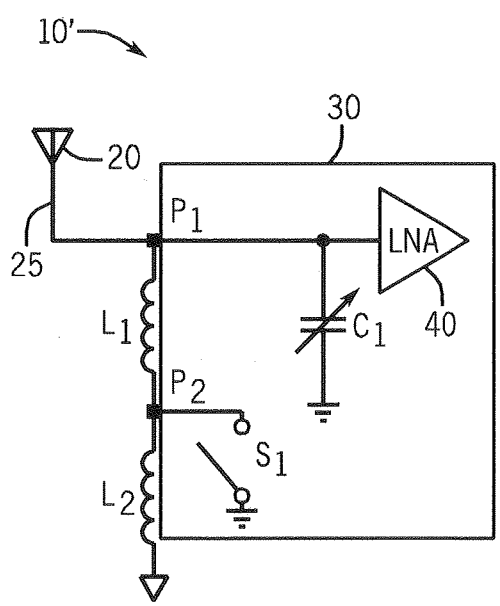
FIG. 1B is a block diagram of a system including a tuner in accordance with another embodiment of the present invention.

In other embodiments, different configurations of switchable inductors can be provided to realize a resonant tank. Referring now to FIG. 1B, shown is a block diagram of a portion of a radio system in accordance with another embodiment of the present invention. As shown in the embodiment of FIG. 1B tuner 30 may be implemented the same as that of FIG. 1A. However, note that in this embodiment, the off-chip inductors are coupled differently. As seen first inductor L1 is coupled between the first and second pins of the IC, while in turn the second inductor L2 is coupled between the second pin and a reference potential node. The configuration of FIG. 1B still provides a parallel resonance LC network. When switch S1 is closed, the inductance provided into the circuit of the resonant tank is L1 only. Instead when the switch is open, the equivalent inductance provided is the combination of L1 and L2 in series, which forms a resonant tank with the varactor C1.

Figure 2A:
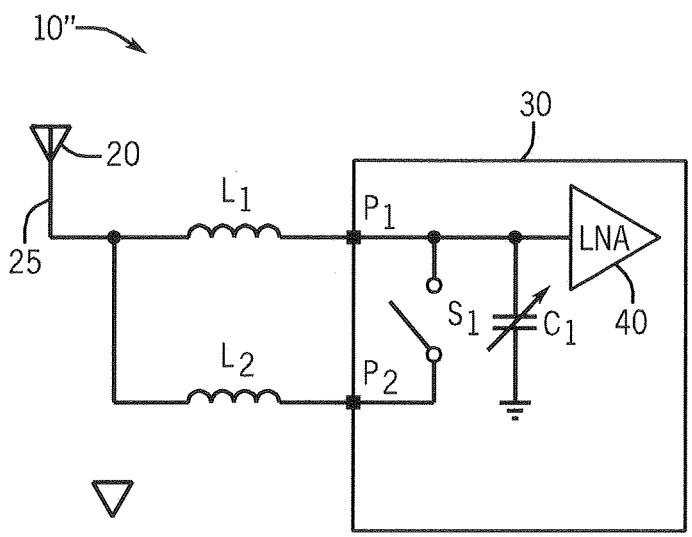
FIG. 2A is a block diagram of a system including a tuner in accordance with yet another embodiment of the present invention.

In other embodiments, rather than having parallel inductances coupled to ground potentials, parallel inductances can be coupled in series along the input signal path. Referring now to FIG. 2A, shown is a block diagram of a tuner in accordance with another embodiment of the present invention. As shown in FIG. 2A, system 10" may be configured similarly to that of FIG. 1A. However, in the embodiment of FIG. 2A, note that inductance L1 is coupled in series along the input signal pathway 25. In addition, inductance L2 may be coupled in parallel with inductance L1 when selected via switch S1. Thus in this implementation, rather than coupling the inductances to a ground potential, the inductances (which when both enabled are coupled in parallel) may instead be coupled in series along the signal path. Also in this embodiment, and assuming a high input impedance LNA, the received signal may appear at the LNA input with a gain boost.

Figure 2B:
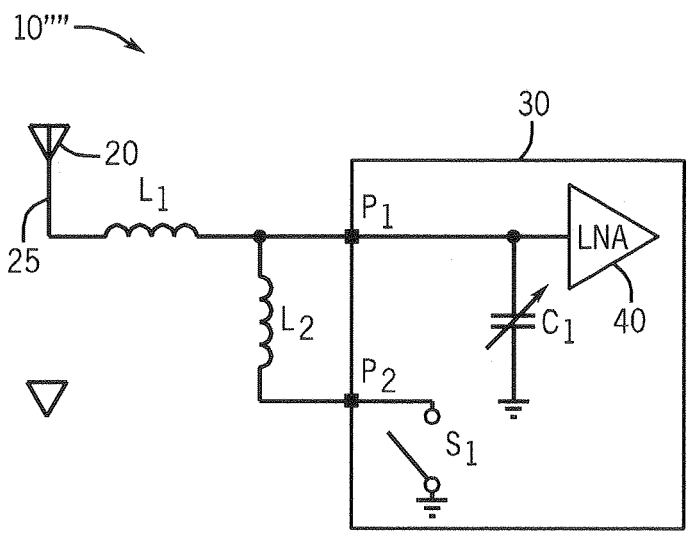
FIG. 2B is a block diagram of a system including a tuner in accordance with a still further embodiment of the present invention.

In yet another implementation, a series resonance network can be realized by providing a first inductor in series with the incoming signal path and a second inductor coupled in parallel with the varactor of the resonance network. Specifically as shown in FIG. 2B, inductor L1 is coupled in series along the RF input signal path and second inductor L2 is coupled between the first and second pins of the IC when enabled by closing of switch S1. In this configuration, when the source impedance is low, inductor L2 may be used primarily to cancel part of the capacitance associated with the LNA input pin, thus boosting the Q of the equivalent series LC resonance network formed by inductor L1 and varactor C1.

While the embodiments shown in FIGS. 1A and 1B and 2A and 2B include multiple different inductors, at least one of which is selectively controlled to be switched into or switched out of a resonant tank circuit, understand that embodiments are not limited in this regard. For example, in other implementations more than 2 inductances may be present, with a selectable number of inductances to be switched in/out depending on a frequency of a selected band. Still further, instead of multiple off-chip inductors, in some embodiments at least one inductor may be provided on-chip with controllability to thus control the inductance realized via a combination of inductors on and off chip.

Figure 2C:
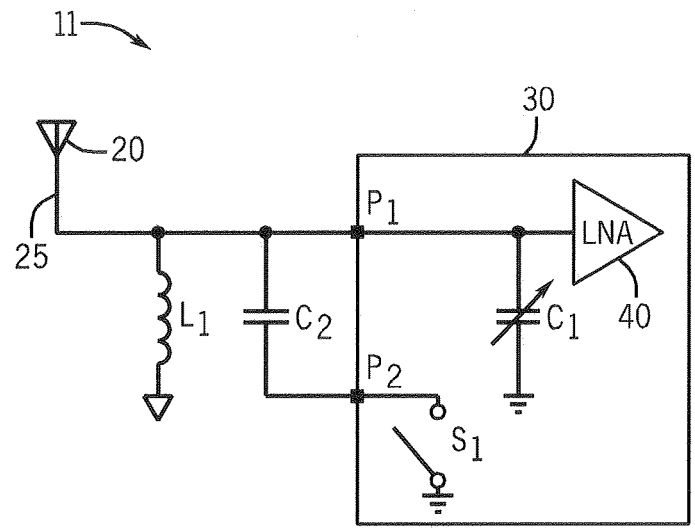
FIG. 2C is a block diagram of a system including a tuner in accordance with yet another embodiment of the present invention.

In still other embodiments, rather than providing controllable inductances, a capacitance can be selectively coupled along with the varactor to resonate out an inductor. For example, instead of having multiple off-chip inductors, a single off-chip inductor may be provided along with an external (or internal) capacitor that can be used to cancel part of the inductor's impedance to thus make the inductor appear as a larger inductance. In this way, the on-chip varactor can still tune over multiple bands. Referring now to FIG. 2C, shown is a block diagram of a system including a tuner in accordance with yet another embodiment of the present invention. As shown in FIG. 2C, system 11 includes similar components as discussed above with regard to the other embodiments. However, instead of having multiple off-chip inductors, a single off-chip inductor L1 is present. Instead, an external capacitor C2 is coupled between the input signal line and the second input pin P2 that in turn is switchably coupled to a reference voltage node of the chip. Thus when controlled to be closed, switch S1 enables the external capacitor C2 to be switched into the circuit to cancel part of the impedance of inductor L1. Such inclusion of this capacitor may be for tuning a channel within the FM/HD band.

Figure 3:
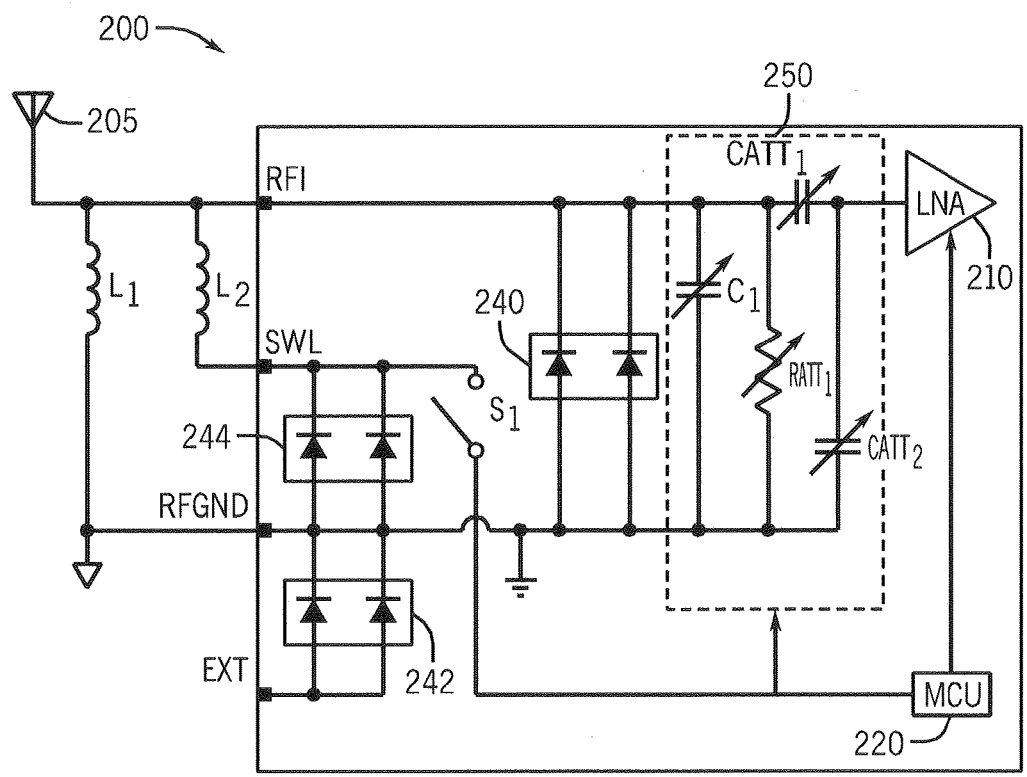
FIG. 3 is a block diagram of a portion of a tuner in accordance with another embodiment of the present invention.

Referring now to FIG. 3, shown is a block diagram of a portion of a tuner 200 in accordance with another embodiment of the present invention. Specifically, FIG. 3 shows an LNA 210 and related support circuitry. Essentially, LNA 210 is controlled via a controller 220, which in one embodiment may be a MCU to provide digital control signals to LNA 210 and other circuitry to control operation of the tuner. In various embodiments, controller 220 may be integrated on a single die of an integrated circuit with LNA 210 and the related circuitry shown in FIG. 3, in addition to other components not shown in FIG. 3. In other embodiments, controller 220 may be off-chip and one or more of the settings controlled by controller 220 may be manually set or controlled via another source.

The support circuitry for LNA 210 includes a single front end having an input stage 250 that is coupled between input pin RFI and the input to LNA 210. The incoming RF signal may be received from an antenna 205. Because embodiments of the present invention permit flexibility as the LNA may have a high input impedance completely unmatched to a source impedance, the antenna may be of any antenna design and impedance level used for a desired application. For example, the antenna may take the form of a half wavelength dipole antenna, an antenna of a different length or type, and may be of virtually any equivalent source impedance. For example, a headphone antenna worn by a user can have a varying impedance depending on proximity to the user, its configuration and so forth.

Input stage 250 may include various components to provide electrostatic discharge protection (ESD) and different attenuation levels, as well as to provide a DC block with respect to incoming signals, along with providing resonance by way of a varactor. In the embodiment shown in FIG. 3, input stage 250 may include an ESD circuit 240 coupled between the input node and a reference potential node. Specifically, as shown in FIG. 3 the reference potential may be a ground potential, such as an RF signal ground (i.e., RFGND) provided via a pin connection (RFGND) of the IC device. Furthermore, input stage 250 may include an attenuation network coupled between the input node and the reference potential node. As shown in FIG. 3, in some embodiments the attenuation network may be formed of adjustable resistances (i.e., $R_{ATT}$) and capacitances (i.e., $C_{att1}$ and $C_{att2}$). The attenuation network may also be digitally controlled via controller 220.

Although these attenuators are present, in typical operation they may not be activated, as in many environments incoming RF signals are not of sufficient strength that attenuation is needed. Note that capacitor $C_{att1}$ of the attenuator network may further act as a coupling capacitance coupled between the input node and the input to LNA 210 if no external AC coupling capacitor is present. In various embodiments, this capacitance may be used to couple an AC voltage to LNA 210, while blocking any DC voltage and also providing desired attenuation.

By setting LNA 210 with a high input resistance, the use of a small coupling capacitor may be realized. As an example, the input resistance of LNA 210 may be between approximately 1 k and 100 k ohms in an embodiment used for an FM receiver, although different values are possible in these and other embodiments. Due to the small capacitance value, in various embodiments the coupling capacitor(s) may be located on the same IC as LNA 210. In various embodiments, the coupling capacitance may be between 1 and 50 picofarads (pF), although the scope of the present invention is not so limited. If instead the input impedance of LNA 210 were required to be matched to an antenna having a source impedance of 50 ohms, for example, the coupling capacitance would be much larger and could not easily be accommodated on-chip. If implemented off-chip, these larger capacitors would add cost and size to a radio tuner. Furthermore, such off-chip capacitor(s) would increase parasitic coupling, impeding performance.

By incorporating one or more inductors into the resonant tank, its resonance frequency may be changed for a given capacitance value of the resonant tank. In general, the resonance frequency of the resonant tank may be according to: $F=1/2\pi\sqrt{LC}$. According to this formula the resonant tank may be set at a frequency within FM/HD bands for receipt and processing of signals within this band, while instead the resonant tank may be set at a higher resonant frequency, e.g., between approximately 174 and 240 MHz, for DAB/DMB band operation.

As further seen in FIG. 3, off-chip inductor L1 may be coupled between the input signal path and the RF ground pin. When selected via switch S1 (under control of MCU 220), inductor L2 may couple between the input signal path and RF ground via another pin SWL. In one embodiment, L1 may be selected such that it is possible to resonate across the entire FM band (from 76 MHz to 108 MHz or from 88 MHz to 108

MHz depending on country) by changing varactor C1 from its minimum to full range. In this case, L1 is resonated with all the parasitic capacitance associated with the RFI and SWL pins. L2 may be selected to be able to resonate across the entire DAB band (from 174 MHz to 240 MHz) by changing varactor C1 from minimum to full range. In this case, the parallel combination of L1 and L2 resonates with the parasitic capacitance associated with the RFI pin. In one embodiment, the inductance values for inductors L1 and L2 may be between approximately 100-150 nanohenries (nH) and between approximately 25-75 nH, respectively. When combined in parallel, these inductances thus may provide a parallel inductance value of L1×L2/(L1+L2). With regard to the capacitance realized via the varactor, in one embodiment a maximum-to-minimum capacitance (CMAX/CMIN) ratio may be on the order of approximately 2.0 to 3.0 and in such embodiment, a range of capacitances available via varactor C1 may be between approximately 0 and 30 pFs.

As further seen in FIG. 3, in addition to the RF ground connection via a third pin of the IC, yet an additional ground can be coupled to the IC via a fourth pin, which can be an externally referenced ground, which may be at a different level than the RF ground level. Using this fourth pin, additional ESD protection can be realized via an ESD circuit 242 coupled between the RF ground and this additional ground pin. Still further, an ESD circuit 244 may be coupled between the RF ground pin and the switchable inductance pin. Controller 220 may thus be coupled to control switch S1 in addition to controlling the various variable elements of the input circuit, namely the varactor and the various attenuation mechanisms. Still further, controller 220 may further control various parameters of the LNA itself.

During operation, the varactor value may be adjusted every time a different desired channel having a different frequency is selected or a change occurs to the front-end attenuation. A table or a curve fit to the points can be used to determine the proper capacitance at each tuned frequency based on calibration data. In one embodiment, the information to generate the table/curve may be stored in a host processor of the system. Then during power up, this information to generate the table can be communicated from the host processor to the tuner IC.

Figure 4:
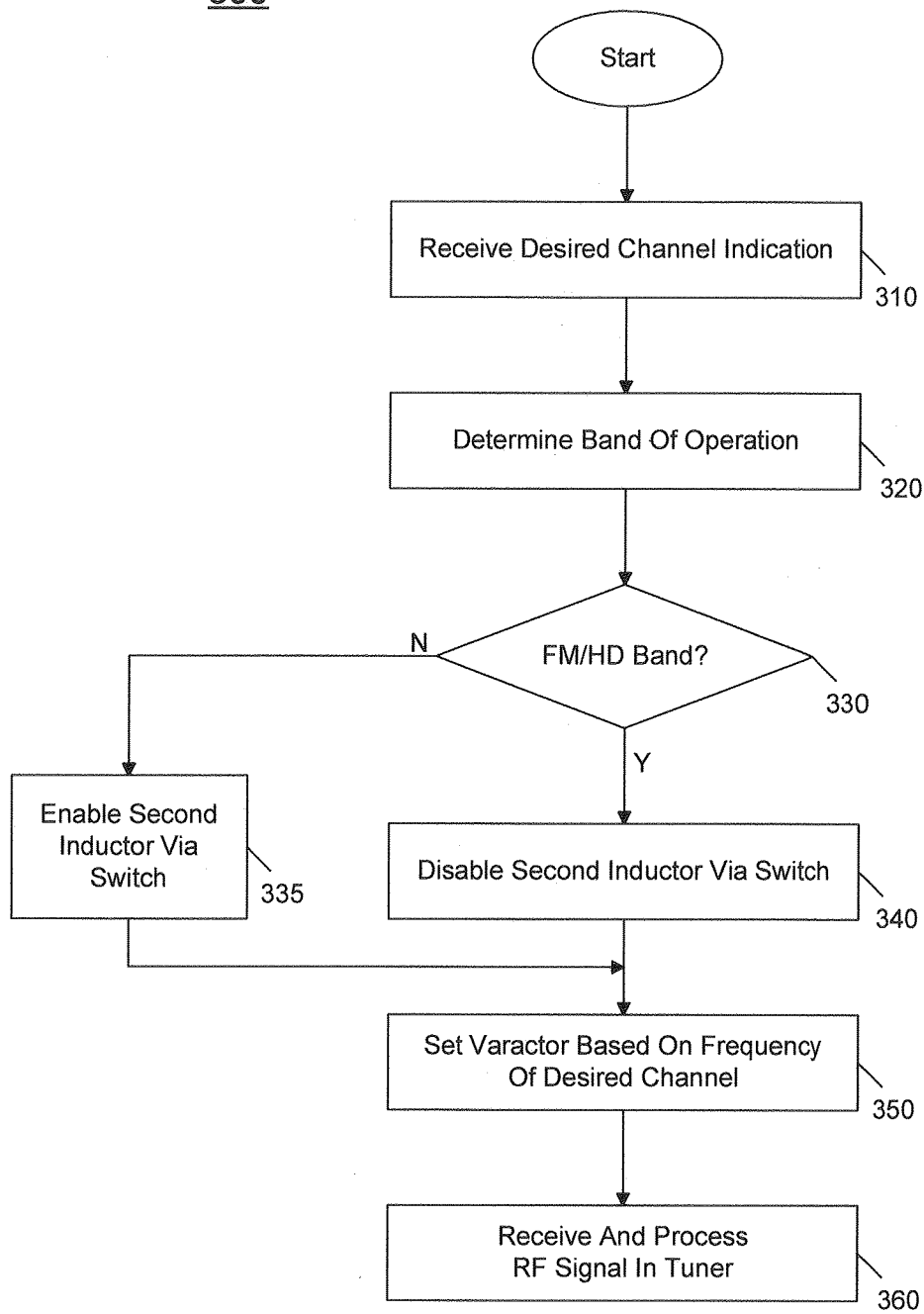
FIG. 4 is a flow diagram of a method in accordance with an embodiment of the present invention.

Referring now to FIG. 4, shown is a flow diagram of a method in accordance with an embodiment of the present invention. As shown in FIG. 4, method 300 may be implemented by a controller of a radio or another controller of a system to control inductances. In the embodiment of FIG. 4 method 300 may begin by receiving a desired channel indication (block 310). For example, a radio tuner MCU may receive an indication of a frequency for a channel requested by a user. From this, the MCU may determine a band of operation (block 320). In one embodiment, the MCU may access a table that provides limits for the frequency ranges for given bands handled by the tuner. From this information, the MCU can determine the band of operation.

Then control may pass to diamond 330 where it may be determined whether the band is a first band, e.g., an FM/HD band. If so, control passes to block 340 where a second inductor may be disabled via a switch. For example, with reference to at least some of FIGS. 1-3, inductor L2 may be de-coupled from a resonant tank by opening the corresponding switch within the radio tuner to thus prevent the inductor from being part of the resonant tank.

If instead the first band is not the selected band, and assuming an implementation in which the radio tuner provides for 2 bands, control then passes to block 335 where the second inductor may be enabled via the switch. Thus in this case the second inductor becomes part of the resonant tank. Note that in a radio tuner that handles greater than 2 bands, additional inductors may be present and controllably switched into or out of a resonant tank circuit depending on band of operation.

Referring still to FIG. 4, to enable receipt and processing of signals of the desired band, control passes to block 350 where a varactor may be set based on the frequency of the desired channel. That is, the controller may control the varactor, which can be a digitally controlled capacitor array, to provide a given amount of capacitance which, along with the selected amount of inductance provides a resonant tank circuit to resonate with the incoming RF signal. Finally, control passes to block 360 where the desired RF signal can be received and processed in the tuner. While shown with this particular implementation in the embodiment of FIG. 4, understand the scope of the present invention is not limited in this regard. For example, in an embodiment with a single off-chip inductor and an external capacitor, the decision at diamond 330 may cause the capacitor to be coupled to the resonant tank (instead of the inductor coupling at block 340) if the desired channel is in the FM/HD band. Otherwise, the capacitor can be de-coupled from the circuit. Furthermore, understand that due to the constant offset of capacitance added when operating in the FM/HD band, the varactor tuning range may differ in this implementation, and further a tuning algorithm (namely the calculation of the correct capacitance and inductance to switch in to tune to the desired channel) may vary. For example, the resonance frequency may be according to: $F = 1/2\pi\sqrt{LC}$, where $C = C_{ext} + C_{var} + C_{par}$, where Cext is the capacitance of the external capacitor (when the external capacitor is switched in), Cvar is the capacitance of the varactor and Cpar includes the capacitance from all the parasitic capacitance.

Figure 5:
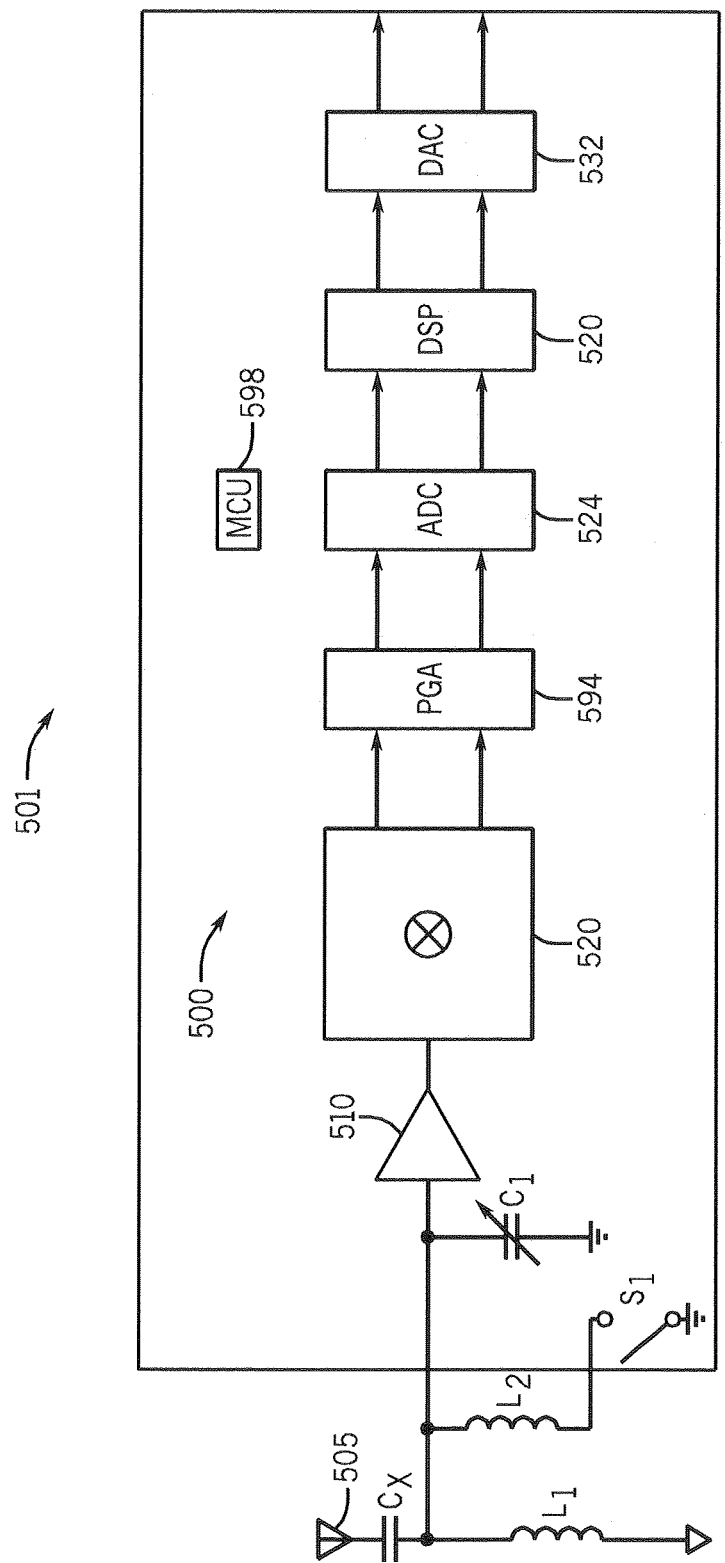
FIG. 5 is a block diagram of a radio system in accordance with an embodiment of the present invention.

Referring now to FIG. 5, shown is a block diagram of a radio system in accordance with an embodiment of the present invention. As shown in FIG. 5, radio system 501 includes a receiver 500 that can be fabricated on a monolithic semiconductor die. The receiver 500 may perform multi-band reception and processing using several different signal processing modes of operations.

An incoming RF signal is received from an external receive antenna 505 and via a signal path including a capacitance $C_X$, one or more inductances L1 and L2, and on to a front end of receiver 500, which is shown with a high level view. After amplification and conditioning in LNA 510, the signal is provided to a mixer 520, which may be a complex mixer, controlled by a tunable local oscillator, the frequency of which selects the desired radio channel to which the receiver 500 is tuned. For tuning control, note that a varactor C1 may also be connected to the RF input pin of receiver 500 such as discussed above. In general, the receiver components through mixer 520 may be considered to be the RF front end components.

In response to the incoming RF signal, mixer 520 produces corresponding analog intermediate frequency (IF), quadrature signals that pass through a programmable gain amplifier (PGA) 594 before being routed to an ADC 524 which converts the analog IF signals from the PGA 594 into digital signals, which are provided to a DSP 530. In general, the components from PGA 594 through ADC 524 may be considered to be an IF section, and which may be configured to operate at a low-IF.

DSP 530 demodulates the received complex signals to provide corresponding digital left and right channel stereo signals at its output terminals; and these digital stereo signals are converted into analog counterparts by a DAC 532, which can provide audio output from the chip, or in some implementations digital outputs can be taken directly from the DSP.

In accordance with some embodiments of the invention, the multimode receiver 500 may also include a MCU 598 that coordinates the general operations of the receiver 500, such as configuring the receiver for a given system implementation. To this end, MCU 598 may include a control storage such as a non-volatile memory (or it may be coupled to an on-chip non-volatile memory) that may include various configuration settings for controlling the various front end and other components for a particular type of system in which the receiver is implemented. For example, based on a band and frequency of a desired channel MCU 598 may output control signals to cause control of the configurable front end components, including whether inductor L2 is to be coupled into the front end, and to control an amount of capacitance of varactor C1. In addition, other settings such as input termination impedance level, as well as providing control signals to control gain and attenuation settings of the various front end components can be performed. As such, embodiments may include an article in the form of a computer-readable medium onto which instructions are written. These instructions may enable the DSP and MCU, or other programmable processor to perform front end configuration and control to perform signal processing, as well as other processing in accordance with an embodiment of the present invention.

Figure 6:
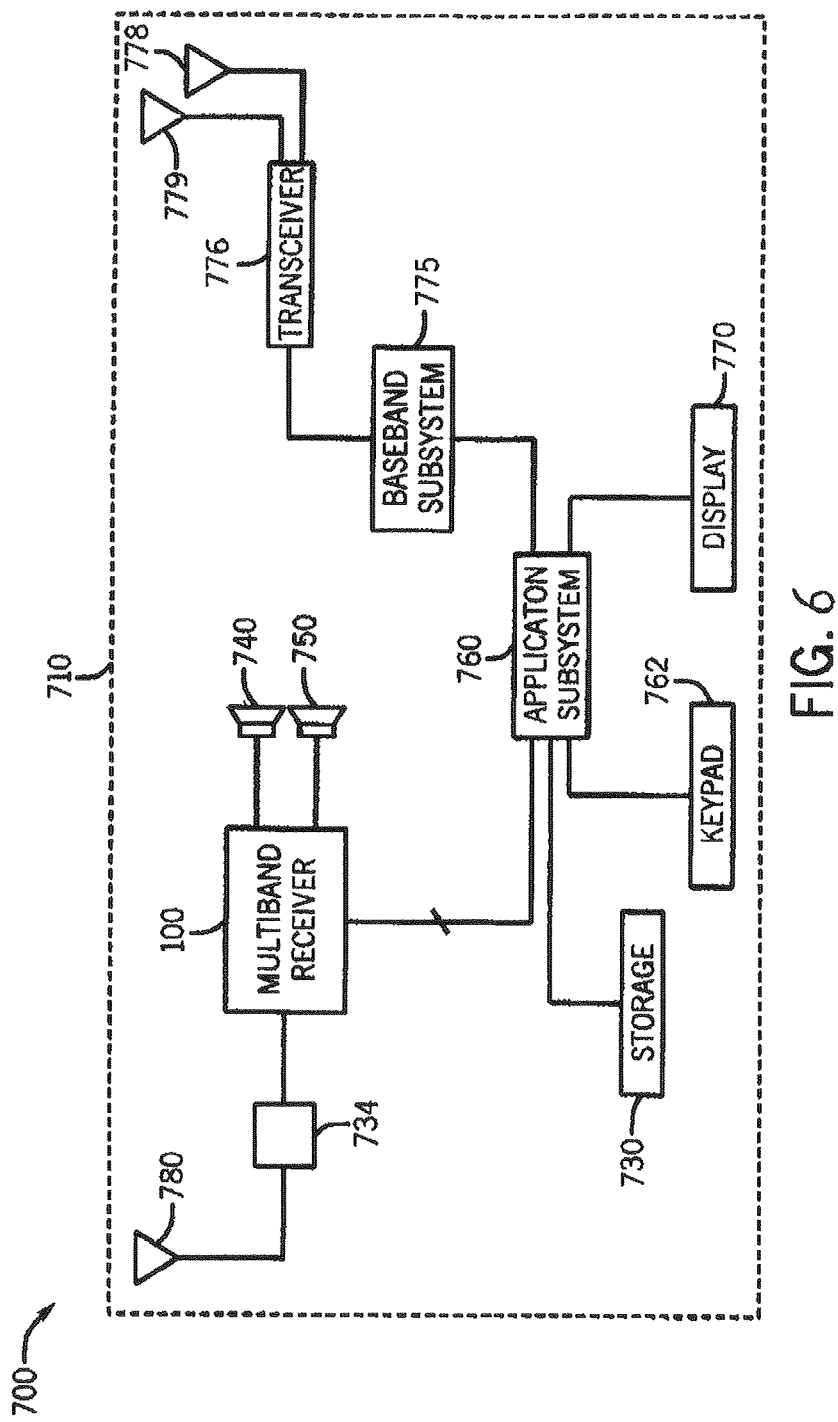
FIG. 6 is a block diagram of a system incorporating a radio in accordance with an embodiment of the present invention.

Embodiments may be implemented in many different system types. Referring to FIG. 6, in accordance with some embodiments of the invention, a multiband receiver 100, which may include a single varactor to interact with multiple selectable inductors in accordance with an embodiment, may be part of a multimedia portable wireless device 710, which in turn is part of a wireless system 700. As examples, the wireless device 710 may be a multi-function, multi-band radio, cellular telephone, smart phone, PDA, tablet computer, mobile game device, or so forth and may play music or book downloads, and may be part of a wireless link between a satellite antenna and a radio receiver, a terrestrial receiver, etc.

Among its other various functions, the wireless device 710 may store digital content on a storage 730, which may be a flash memory or hard disk drive, as a few examples. The wireless device 710 generally includes an application subsystem 760 that may, for example, receive input from a keypad 762 of the wireless device 710 (which may be a touch pad, e.g., of a display 770) and display information on display 770. Furthermore, the application subsystem 760 may generally control the retrieval and storage of content from the storage 730 and the communication of, e.g., audio from receiver 100. As shown, receiver 100 may be directly connected to speakers 740 and 750 for output of audio data (understand that in some embodiments a separate audio processor may be integrated between the receiver and speakers). As depicted in FIG. 6, the multimode receiver 100 may be coupled by a matching network 734 to a receiver antenna 780, or in some embodiments the matching network may not be present.

In accordance with some embodiments of the invention, the wireless device 710 may have the ability to communicate over a communications network, such as a wide area, local area, or personal wireless network. For these embodiments, the wireless device 710 may include a baseband subsystem 775 that is coupled to the application subsystem 760 for purposes of encoding and decoding signals for this wireless network. Baseband subsystem 770 may be coupled to a transceiver 776 that is connected to corresponding transmit and receive antennas 778 and 779.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a receiver formed on a single semiconductor die adapted in an integrated circuit (IC), the receiver having a single radio frequency (RF) front end including a low noise amplifier (LNA) coupled to a first pin of the IC to receive and process RF signals of a first frequency band and a second frequency band via a single signal path, the single RF front end including a varactor to provide a selected capacitance level to resonate with an inductance coupled to the IC, the receiver further including a controller to cause a capacitor to be coupled with the inductance if the RF signal is of the first frequency band.

2. The apparatus of claim 1, wherein the controller is to couple the capacitor to a reference potential node of the IC via a second pin of the IC if the RF signal is of the first frequency band.

3. The apparatus of claim 2, further comprising a switch coupled to the capacitor to selectively couple the capacitor to the reference potential node under control of the controller.

4. The apparatus of claim 2, wherein the capacitor is formed on the single semiconductor die.

5. The apparatus of claim 2, wherein the capacitor is an off-chip capacitor.

6. The apparatus of claim 2, wherein the capacitor is coupled between the first pin and the second pin.

7. The apparatus of claim 2, wherein the inductance is to couple to the first pin.

8. The apparatus of claim 2, further comprising a second capacitor coupled to the LNA.

9. The apparatus of claim 8, wherein the second capacitor is to couple in parallel with the capacitor.

10. The apparatus of claim 8, wherein the second capacitor comprises a varactor.

11. The apparatus of claim 8, wherein the controller is further to control the varactor responsive to a desired radio channel.

12. A method comprising:
    receiving a desired channel indication in a radio tuner;
    determining a band of operation in which the desired channel is located, and if the desired channel is within a first frequency band coupling a capacitor into a resonant tank including a first inductor coupled to a first pin of the radio tuner and a varactor internal to the radio tuner, the capacitor switchably coupled to a second pin of the radio tuner; and
    if the desired channel is within a second frequency band, not coupling the capacitor to the resonant tank.

13. The method of claim 12, further comprising setting the varactor based on a frequency of the desired channel.

14. The method of claim 12, further comprising receiving and processing a radio frequency (RF) signal of the desired channel in the radio tuner.

15. A system comprising:
    an antenna to receive a radio frequency (RF) signal, the antenna coupled to a first pin of an integrated circuit (IC) including a radio tuner;
    a first inductor fixably coupled to the first pin of the IC, wherein the first inductor and a varactor of the IC form a resonant tank;
    a capacitor switchably coupled to the resonant tank via a second pin of the IC; and
    a controller to control coupling of the capacitor to the resonant tank when a frequency of a desired channel is in a first band, the controller further to de-couple the capacitor from the resonant tank when the frequency of the desired channel is in a second band.

16. The system of claim 15, wherein the controller is to couple the capacitor to a reference potential node of the IC via the second pin of the IC if the frequency of the desired channel is in the second band.

17. The system of claim 16, wherein the IC further comprises a switch to couple to the capacitor to the reference potential node under control of the controller.

18. The system of claim 15, wherein the capacitor is an off-chip capacitor.

19. The system of claim 18, wherein the capacitor is coupled between the first pin and the second pin.

20. The system of claim 15, further comprising a storage to store media files.

* * * * *